(12) United States Patent
Kandala et al.

(10) Patent No.: US 11,004,833 B1
(45) Date of Patent: May 11, 2021

(54) MULTI-CHIP STACKED DEVICES

(71) Applicant: XILINX, INC., San Jose, CA (US)

(72) Inventors: Anil Kumar Kandala, Hyderabad (IN); Vijay Kumar Koganti, Hyderabad (IN); Santosh Yachareni, Hyderabad (IN); Sundeep Ram Gopal Agarwal, Hyderabad (IN)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/792,560

(22) Filed: Feb. 17, 2020

(51) Int. Cl.
*H01L 25/065* (2006.01)
*H01L 23/48* (2006.01)

(52) U.S. Cl.
CPC ........ *H01L 25/0657* (2013.01); *H01L 23/481* (2013.01)

(58) Field of Classification Search
CPC combination set(s) only.
See application file for complete search history.

(56) References Cited

U.S. PATENT DOCUMENTS

| | | | |
|---|---|---|---|
| 7,642,173 B2* | 1/2010 | McDonald | H01L 25/50 438/455 |
| 9,564,420 B2* | 2/2017 | Yu | H01L 24/20 |
| 2009/0045487 A1* | 2/2009 | Jung | H01L 23/525 257/621 |
| 2013/0037802 A1* | 2/2013 | England | H01L 25/18 257/48 |
| 2015/0130078 A1* | 5/2015 | Hong | H01L 23/3128 257/774 |
| 2016/0049377 A1* | 2/2016 | Kim | H01L 24/13 257/621 |
| 2017/0053898 A1* | 2/2017 | Yeh | H01L 24/81 |
| 2019/0238134 A1* | 8/2019 | Lee | H03K 19/1776 |
| 2019/0245543 A1* | 8/2019 | Lee | G11C 11/412 |
| 2019/0326273 A1* | 10/2019 | Bhagavat | H01L 23/4334 |
| 2020/0185039 A1* | 6/2020 | Chibvongodze | G11C 11/5642 |
| 2020/0312766 A1* | 10/2020 | Bhagavat | H01L 23/5283 |

* cited by examiner

*Primary Examiner* — Mamadou L Diallo
(74) *Attorney, Agent, or Firm* — Patterson + Sheridan, LLP

(57) ABSTRACT

Examples described herein generally relate to multi-chip devices having stacked chips. In an example, a multi-chip device includes a chip stack that includes chips. Neighboring chips are connected to each other. Plural chips of the chips collectively include columns of broken via pillars and bridges. Each of the plural chips has a broken via pillar in each column. The broken via pillar has first and second continuous via pillar portions aligned in a direction normal to a side of a semiconductor substrate of the respective chip. The first continuous via pillar portion is not connected within the broken via pillar to the second continuous via pillar portion. Each of the plural chips has one or more of the bridges. Each bridge connects, within the respective chip, the first continuous via pillar portion in a column and the second continuous via pillar portion in another column.

20 Claims, 5 Drawing Sheets

MULTI-CHIP STACKED DEVICES

TECHNICAL FIELD

Examples of the present disclosure generally relate to multi-chip stacked devices containing stacked chips.

BACKGROUND

Apparatuses, including modules and/or packages, that include multiple integrated circuit chips have been developed. The forms of such apparatuses are varied. By forming such apparatuses, an electronic device can integrate multiple chips to form the device, where each chip can be manufactured using standard semiconductor processing to then be assembled and packaged to form a larger, multi-functional device. By having different chips, in some instances, semiconductor processing that is difficult to integrate can be separated, such as when parts of one chip require a different process from another chip.

Another aspect is an ability to build a device having chips with different functionalities (for example, some are field programmable gate array (FPGA) chips and some are memory chips) into a same apparatus with a smaller device size and more functionality and lower power. Semiconductor processes for a chip can be more focused to give devices a greater edge in areas such as increased performance of the chip, reduced costs, and increased yield in manufacturing. Other benefits can be realized by such apparatuses.

SUMMARY

Examples described herein generally relate to multi-chip devices having vertically stacked chips. More specifically, various chips of a chip stack can include broken via pillars aligned in columns across multiple chips where bridges between columns can form staggered via pillars. The staggered via pillars can form communication paths between, e.g., a base chip of the chip stack and another chip, with any number of chips intervening therebetween. Such examples can implement non-programmable, non-volatile structures and communication paths as the staggered via pillars. Programming of the structures and communication paths can be obviated. The structures can be used in high voltage operations and can be used in a power up sequence. A same hardware layout can be implemented for intervening chip(s) and/or the distal chip in a chip stack, which can reduce the number of tape-outs to implement the chip stack and reduce the cost to develop the chip stack.

An example described herein is a multi-chip device. The multi-chip device includes a chip stack. The chip stack includes chips. Neighboring ones of the chips are connected to each other. A plurality of the chips collectively include columns of broken via pillars and bridges. Each chip of the plurality of the chips has a broken via pillar in each column of the columns. The broken via pillar has a first continuous via pillar portion and a second continuous via pillar portion aligned in a direction normal to a side of a semiconductor substrate of the respective chip. The first continuous via pillar portion is not connected within the broken via pillar to the second continuous via pillar portion. Each chip of the plurality of the chips has one or more of the bridges. Each bridge of the bridges connects, within the respective chip, the first continuous via pillar portion in a column of the columns and the second continuous via pillar portion in another column of the columns.

Another example described herein is a method of operating a multi-chip device. A signal is communicated between a first chip and a second chip. The first chip and the second chip are in a chip stack. One or more intervening chips are disposed in the chip stack between the first chip and the second chip. At each of the one or more intervening chips, communicating the signal includes communicating the signal from a broken via pillar column to another broken via pillar column. Each of the broken via pillar columns extends across the one or more intervening chips. Each of the broken via pillar columns at each of the one or more intervening chips includes a first continuous via pillar portion and a second continuous via pillar portion disposed in the respective chip. The first continuous via pillar portion is not connected within the respective broken via pillar column to the second continuous via pillar portion.

Another example described herein is a multi-chip device. The multi-chip device includes a chip stack. The chip stack includes chips. A first chip of the chip stack including a first continuous via pillar portion, a second continuous via pillar portion, a third continuous via pillar portion, and a bridge. The first continuous via pillar portion has a first pad at an interface between the first chip and an underlying chip of the chip stack. The first continuous via pillar portion is connected through an interconnection to an active circuit of the first chip. The second continuous via pillar portion has a second pad at an interface between the first chip and an overlying chip of the chip stack. The second pad is aligned with the first pad. The second continuous via pillar portion is not connected to the first continuous via pillar portion. The third continuous via pillar portion has a third pad at the interface between the first chip and the underlying chip. The bridge connects the third continuous via pillar portion and the second continuous via pillar portion.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
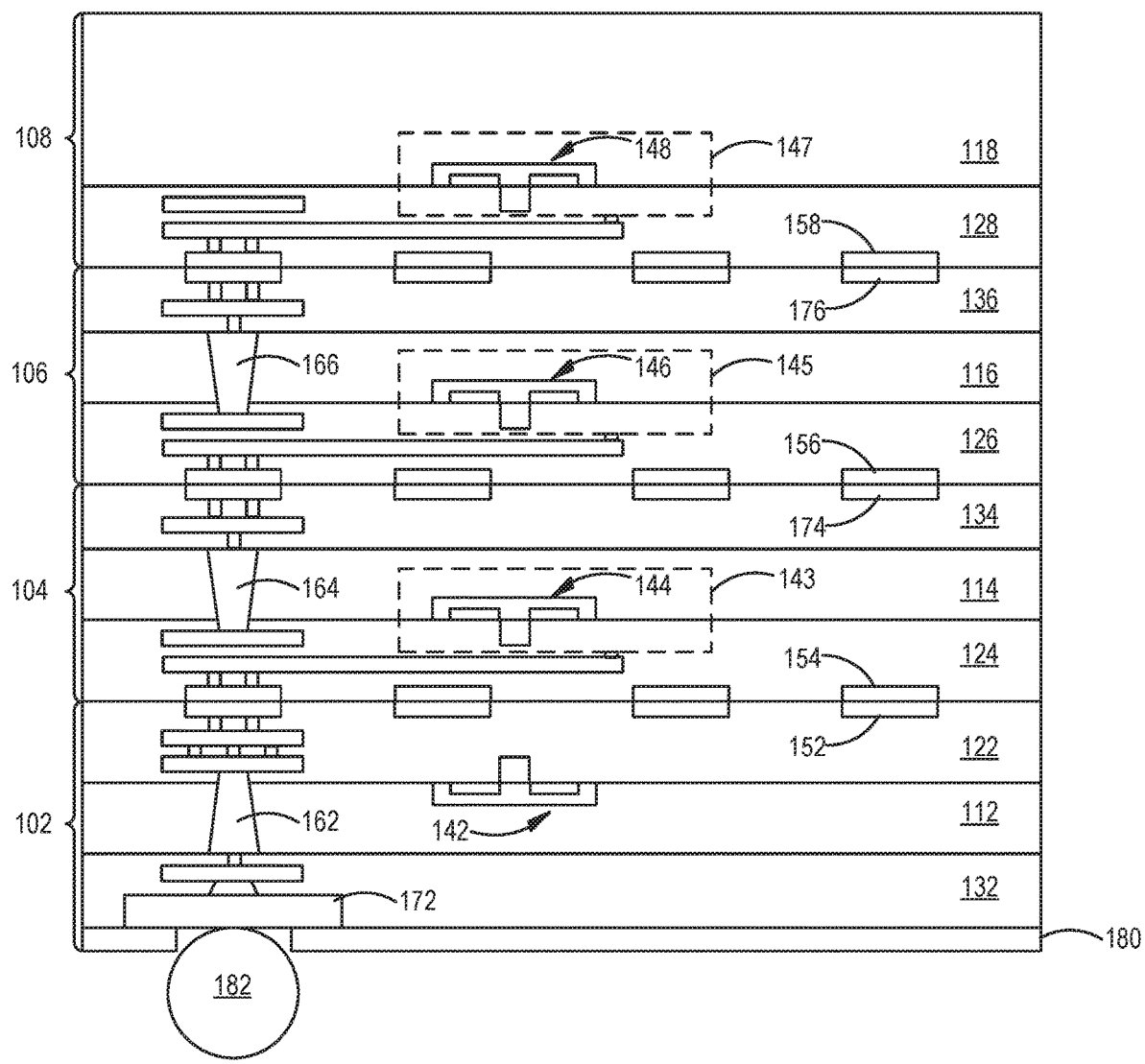
FIG. 1 is a structure of a multi-chip device having a chip stack according to some examples.

Examples described herein generally relate to multi-chip devices having vertically stacked chips. More specifically, some examples described herein relate to structures within chips of the stacked chips for communicating signals between chips. Generally, a chip stack can include a base chip, one or more intervening chips, and a distal chip, where the one or more intervening chips are disposed between the base chip and the distal chip. Columns of broken via pillars are formed across the one or more intervening chips and, in some examples, into the distal chip. Within each column in each of the chips across which the respective column extends, the respective column includes a first continuous via pillar portion and a second continuous via pillar portion that are aligned within the column (e.g., in a direction normal to a front side of the semiconductor substrate of the respective chip). The first continuous via pillar portion and second continuous via pillar portion are not connected to each other within the respective column. Within each of those chips, a bridge extends between and connects a first continuous via pillar portion of a column and a second continuous via pillar portion of another column. A first continuous via pillar portion of a column connected with a second continuous via pillar portion of another column by a bridge can form a staggered via pillar through the respective chip.

Each of the intervening chip(s) and distal chip can include an active circuit. Each active circuit of the respective chips can be connected to a same column of broken via pillars for communicating signals between the respective active circuit and the base chip. The base chip can have an interface, e.g., of bond pads, connected to the different columns of broken via pillars. The base chip can have a circuit(s) configured to communicate with the different active circuits of the other chips. At the base chip, signals can be communicated through different columns towards target active circuits on different chips. A signal can be translated from one column to another column at each chip intervening between the base chip and the chip that includes the targeted active circuit. This translation can result in signals being communicated with the active circuits through the same column, albeit at different chips.

Stacking chips, e.g., in a three-dimensional integrated circuit (3DIC) can create multiple and larger end products with different combinations of chips. This can reduce the number of tape-outs required and can reduce product development costs if chips with a same hardware layout are implemented in the chip stack. Larger products of, e.g., Field Gate Programmable Arrays (FPGAs), System-on-Chips (SoCs), processors, and/or Application Specific Integrated Circuits (ASICs) can be created with fewer (e.g., one) tape-outs by stacking chips having a same hardware layout. Cost savings can be leveraged when chips used in a chip stack have a same hardware layout, since, for example, research and development can be reduced for fewer tape-outs.

A challenge in stacking chips with multiple chips having a same hardware layout is communicating signals between chips. Since every chip that has a same hardware layout receives or transmits the signal at the same physical location within the respective chip, the signal intended for one chip is also received at each chip that has a same hardware layout. Various previous solutions addressed this by programming active circuitry to control communicating the signals between different active circuits. These previous solutions, however, had challenges in that, for example, the programmability could create reliability issues and/or the control might not be able to be programmed prior to power up, which could preclude communicating some signals during a power up sequence.

To address these challenges, in some examples described herein, staggered via pillars can be implemented in chips having a same hardware layout such that signals communicated with active circuits on different ones of the chips can be transmitted or received at a same physical location, e.g., through a same column, at the respective chip. Signals communicated with active circuits of different chips can be communicated through different columns at, e.g., a base chip. Hence, signals can be communicated with the base chip through different columns at the base chip, translated to other columns at any intervening chip(s), and communicated with the active circuits of different chips through the same column at the respective chip. Such examples can implement non-programmable, non-volatile structures and communication paths as the staggered via pillars. Hence, programming of the structures and communication paths can be obviated. The structures can be used in high voltage operations and can be used in a power up sequence. Additionally, a same hardware layout can be implemented for intervening chip(s) and/or the distal chip, which can reduce the number of tape-outs to implement the chip stack and reduce the cost to develop the chip stack.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described. Further, methods described herein may be described in a particular order of operations, but other methods according to other examples may be implemented in various other orders (e.g., including different serial or parallel performance of various operations) with more or fewer operations. Various components described as a "first", "second", etc. of the component does not connote or imply any structure or position resulting from the "first", "second", etc. "First", "second", etc. are used herein to easily refer to different components.

FIG. 1 is a structure of a multi-chip device according to some examples. The multi-chip device of FIG. 1 includes a chip stack that includes a base chip 102 and fabric chips 104, 106, 108. The base chip 102 and fabric chips 104-108 are described herein as examples. Although the different chips are described herein as being or including various integrated circuits (ICs) or components (e.g., fabric, base, programmable logic, etc.), aspects described herein can be generally applicable to chips of a multi-chip device having any type of IC or component.

In the multi-chip device of FIG. 1, the fabric chips 104-108 are arranged active or front side facing down towards the base chip 102, where the base chip 102 is arranged active or front side facing up towards the fabric chips 104-108. In other multi-chip devices, intermediate fabric chips are arranged active or front side facing up away from the base chip 102, and a distal fabric chip is arranged active or front side facing down towards the base chip 102, where the base chip 102 is arranged active or front side facing up towards the fabric chips 104-108. Various other multi-chip devices can have different structures, different number of chips, additional components, etc.

Generally, the chips 102-108 are stacked and form a chip stack in the multi-chip device. The chips 102-108 are stacked to form, in some examples, an Active die-on-Active die (AoA) device. Each of the chips 102-108 can include an active IC. In some examples, more or fewer chips can be included in the chip stack. For example, a multi-chip device can have two chips, such as a base chip and a fabric chip, or two fabric chips. In other examples, a multi-chip device can have three chips, four chips, five chips, etc.

Each of the chips 102-108 includes a respective semiconductor substrate 112, 114, 116, 118 and respective front side dielectric layer(s) 122, 124, 126, 128 on a front side of the respective semiconductor substrate 112-118. The front side dielectric layer(s) 122-128 include metallization (e.g., metal lines and/or vias) (illustrated but not specifically numbered) formed therein which can electrically connect various components in an IC. Each of the chips 102-106 includes respective backside dielectric layer(s) 132, 134, 136 on a backside of the respective semiconductor substrate 112-116. The backside dielectric layer(s) 132-136 include metallization (e.g., metal lines and/or vias) (illustrated but not specifically numbered) formed therein which can electrically connect various components in an IC. As illustrated, metallization in front side dielectric layer(s) 124, 126, 128 of the fabric chips 104, 106, 108 connect to respective circuit regions 143, 145, 147 of the fabric chips 104, 106, 108 in which respective active circuits can be formed. Such connections and example active circuits will be described in further detail below in the context of subsequent figures.

Each semiconductor substrate 112-118 of the chips 102-108 includes, e.g., a transistor 142, 144, 146, 148 formed on and/or in the front side surface of the respective semiconductor substrate 112-118. The transistor 142-148 and any other components can be connected to the metallization in the front side dielectric layer(s) 122-128. The transistor 144, 146, 148 is illustrated in the respective circuit region 143, 145, 147 of the fabric chip 104, 106, 108; however, the transistor 144, 146, 148 and/or other transistors can be outside of the circuit region 143, 145, 147. Each semiconductor substrate 112-116 of the respective chip 102-106 has backside through-substrate via(s) (TSV(s)) 162, 164, 166 therethrough, which can electrically connect the metallization in the front side dielectric layer(s) 122-126 to the metallization in the backside dielectric layer(s) 132-136 of the respective chip 102-106.

Front side bond pads 152, 154, 156, 158 (e.g., metal (e.g., Cu) bond pads) are formed in the respective front side dielectric layer(s) 122-128 of the chips 102-108 at an exterior surface distal from the respective semiconductor substrate 112-118. The front side bond pads 152-158 can be in an arrangement that forms a respective chip-to-chip interface. The front side bond pads 152-158 are connected to the metallization in the respective front side dielectric layer(s) 122-128. Backside bond pads 174, 176 (e.g., metal (e.g., Cu) bond pads) are formed in the respective backside dielectric layer(s) 134, 136 of the fabric chips 104, 106 at an exterior surface distal from the respective semiconductor substrate 114, 116. The backside bond pads 174, 176 can be in an arrangement that forms a respective chip-to-chip interface. The backside bond pads 174, 176 are connected to the metallization in the respective backside dielectric layer(s) 134, 136.

Exterior connector backside pads 172 (e.g., metal (e.g., aluminum) pads) are formed in the backside dielectric layer(s) 132 of the base chip 102 at an exterior surface distal from the semiconductor substrate 112 of the base chip 102. The exterior connector backside pads 172 are connected to the metallization in the backside dielectric layer(s) 132 of the base chip 102. A passivation layer 180 is formed on the exterior surface distal from the semiconductor substrate 112 of the base chip 102 with respective openings therethrough exposing the exterior connector backside pads 172. External connectors 182 (e.g., controlled collapse chip connections (C4), minibumps, etc.) are formed on respective exterior connector backside pads 172 through the openings in the passivation layer 180.

The external connectors 182 can be attached to a package substrate. The package substrate may further be attached to, e.g., a printed circuit board (PCB) to attach the package substrate (and hence, the multi-chip device) to the PCB. Various other components can be included in a multi-chip device. For example, an interposer, an encapsulant (such as a molding compound (MUF) or the like), etc. can be included in the multi-chip device. A person having ordinary skill in the art will readily envision various modifications that can be made to the multi-chip device.

The chips 102-108 are bonded (e.g., by hybrid bonding using metal-to-metal and oxide-to-oxide bonding) together to form a chip stack. The base chip 102 is bonded to the fabric chip 104 front side to front side such that the front side bond pads 152 and exterior surface of the front side dielectric layer(s) 122 of the base chip 102 are bonded to the front side bond pads 154 and exterior surface of the front side dielectric layer(s) 124 of the fabric chip 104. The fabric chip 104 is bonded to the fabric chip 106 backside to front side such that the backside bond pads 174 and exterior surface of the backside dielectric layer(s) 134 of the fabric chip 104 are bonded to the front side bond pads 156 and exterior surface of the front side dielectric layer(s) 126 of the fabric chip 106. The fabric chip 106 is bonded to the fabric chip 108 backside to front side such that the backside bond pads 176 and exterior surface of the backside dielectric layer(s) 136 of the fabric chip 106 are bonded to the front side bond pads 158 and exterior surface of the front side dielectric layer(s) 128 of the fabric chip 108.

Other arrangements of bonding can be implemented. For example, the base chip 102 can be bonded to the fabric chip 104 front side to backside such that the front side bond pads 152 and exterior surface of the front side dielectric layer(s) 122 of the base chip 102 are bonded to the backside bond pads 174 and exterior surface of the backside dielectric layer(s) 134 of the fabric chip 104. The fabric chip 104 can be bonded to the fabric chip 106 front side to backside such that the front side bond pads 154 and exterior surface of the front side dielectric layer(s) 124 of the fabric chip 104 are bonded to the backside bond pads 176 and exterior surface of the backside dielectric layer(s) 136 of the fabric chip 106. The fabric chip 106 can be bonded to the fabric chip 108 front side to front side such that the front side bond pads 156 and exterior surface of the front side dielectric layer(s) 126 of the fabric chip 106 are bonded to the front side bond pads 158 and exterior surface of the front side dielectric layer(s) 128 of the fabric chip 108.

In other examples, the chips 102-108 can be attached together using external connectors (such as minibumps, solder, etc.). In some examples, some of the chips 102-108 can be attached together by external connectors while others of the chips can be bonded together without use of external connectors. Any permutation of bonding and use of external connectors can be implemented.

Any of the chips in the chip stack can include a Z-interface circuit. A Z-interface circuit can enable communications of signals between chips in the chip stack. The Z-interface circuit can include staggered via pillars. Each staggered via pillar includes a first continuous via pillar portion (e.g., that includes a TSV) in a first broken via pillar and a second continuous via pillar portion (e.g., that does not include a TSV) in a second broken via pillar, where a bridge (e.g., a metal line) extends between and connects the first continuous via pillar portion and the second continuous via pillar portion.

Each broken via pillar includes metal lines/pads and vias in the respective front side dielectric layer(s), a TSV through the respective semiconductor substrate, and metal line(s)/pad(s) and/or via(s) in the respective backside dielectric layer(s), where the metal lines/pads, vias, and TSVs are generally aligned in a direction normal to the front side surface of the respective semiconductor substrate. A continuous via pillar portion of a broken via pillar is formed of the metal line(s)/pad(s) and via(s) in the respective backside dielectric layer(s), TSV, and at least some of the metal lines/pads and vias in the respective front side dielectric layer(s), and another continuous via pillar portion of the broken via pillar is formed of at least some of the metal lines/pads and vias in the respective front side dielectric layer(s). The different continuous via pillar portions in a broken via pillar are not connected to each other in the broken via pillar (e.g., a metal feature such as a via or metal line/pad is omitted at a metal layer in the broken via pillar).

Columns of broken via pillars can be disposed across and aligned in multiple chips in a chip stack, such as across the fabric chips 104-108. Each column can include one or more broken via pillar in each of the multiple chips. A staggered via pillar in a chip can therefore bridge across two columns in the multiple chips. In such a configuration, each chip of the multiple chips can transmit or receive a signal to or from a same column. As the signal propagates through any intervening chip, the signal is translated to another column at each intervening chip through a bridge of a staggered via pillar. Additional details of a Z-interface circuit are described below. Any of the chips 102-108 can include a Z-interface circuit, although, in some examples, the distal fabric chip 108 may omit a TSV and/or metallization in a backside dielectric layer since the distal fabric chip 108 may not undergo backside processing.

In some examples, each of the fabric chips 104-108 includes a processing IC. A processing IC can generally include any circuit configured to or configurable to process any data and/or signal and output data and/or a signal resulting from that processing, and is more than merely memory and any circuit ancillary to memory (e.g., address decoder, memory controller, etc.). The processing IC of the fabric chips 104-108 is generally a same IC. The hardware topology, architecture, and layout of the fabric chips 104-108 are the same in some examples, except that the distal fabric chip 108 may omit components formed by backside processing, such as backside TSVs, backside dielectric layer(s), and/or metallization in backside dielectric layer(s). In some examples, the processing IC of the fabric chips 104-108 includes one or more programmable logic regions (e.g., fabric of a FPGA), which has the same hardware topology, architecture, and layout between the fabric chips 104-108. Having Z-interfaces in the fabric chips 104-108 can permit chips undergoing a same front side processing to be integrated in a multi-chip device.

In other examples, the chips 102-108 can each be or include a different IC or can have any permutation of including a same IC and/or different ICs. For example, any of the fabric chips 104-108 can be or include a processing IC or memory. In some examples, the chip 108 is an ASIC. Any chip 102-108 may generically be referred to as an active chip.

Figure 2:
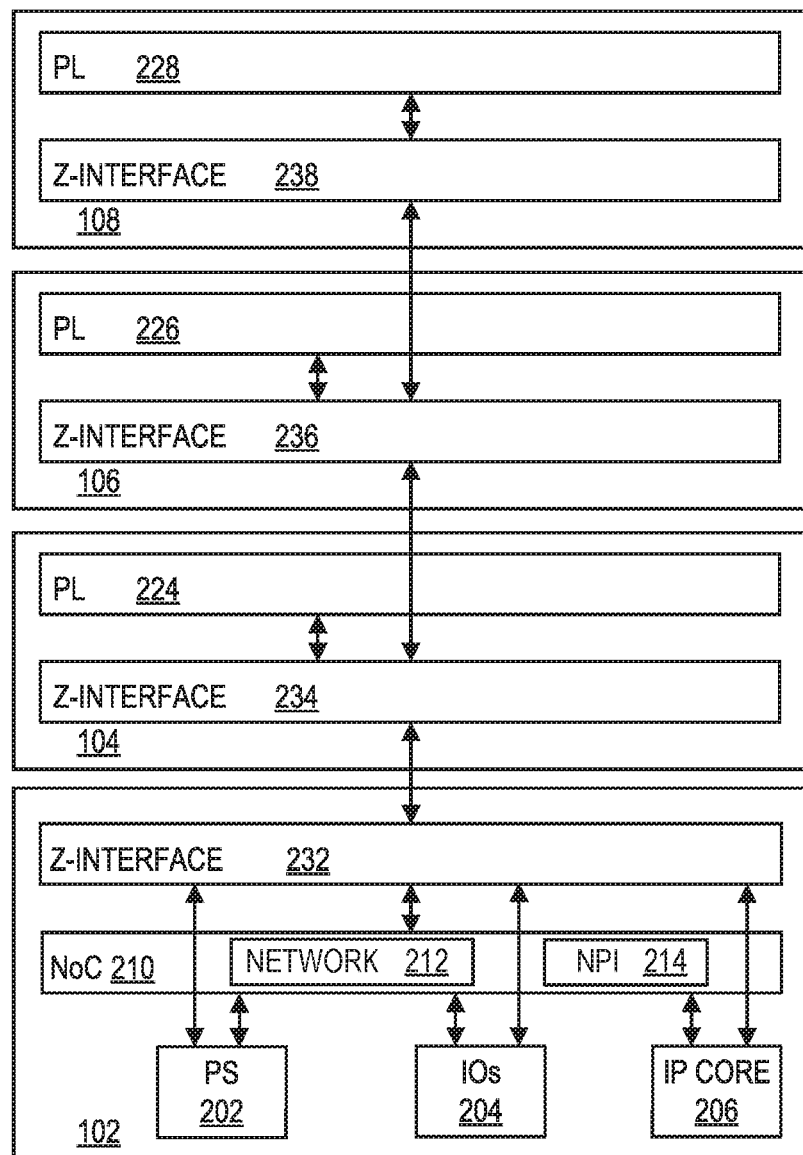
FIG. 2 is a block diagram of a circuit schematic depicting integrated circuits of the chip stack of the multi-chip device of FIG. 1 according to some examples.

FIG. 2 is a block diagram of a circuit schematic depicting ICs of a chip stack of the multi-chip device of FIG. 1 according to some examples. In the illustrated example, the multi-chip device is a multi-chip programmable device. The circuit schematic can be implemented in the multi-chip device of FIG. 1, e.g., regardless of the orientation of the fabric chips 104, 106.

In the illustrated example, the base chip 102 includes a base IC on the base chip 102, which may be a SoC. The fabric chips 104, 106, 108 include a respective programmable logic (PL) IC 224, 226, 228, which, in some examples, is a same IC and has a same hardware layout and topology. These ICs are provided as an example implementation. Other ICs (e.g., with other hard IP blocks) can be implemented in the chips. The fabric chips 104, 106, 108 further include a respective Z-interface 234, 236, 238.

The base IC on the base chip 102 includes a processing system 202, input/output circuits (IOs) 204, IP core circuits 206, a Network-on-Chip (NoC) 210, and a Z-interface 232. The processing system 202 may be or include any of a variety of different processor types and number of processor cores. For example, the processing system 202 may be implemented as an individual processor, e.g., a single core capable of executing program instruction code. In another example, the processing system 202 may be implemented as a multi-core processor. The processing system 202 may be implemented using any of a variety of different types of architectures. Example architectures that may be used to implement the processing system 202 may include an ARM processor architecture, an x86 processor architecture, a graphics processing unit (GPU) architecture, a mobile processor architecture, a reduced instruction set computer (RISC) architecture (e.g., RISC-V), or other suitable architecture that is capable of executing computer-readable program instruction code.

The input/output circuits 204 can include eXtreme Performance Input/Output (XPIO), multi-gigabit transceivers (MGTs), high bandwidth memory (HBM) interfaces, Analog-to-Digital Converters (ADC), Digital-to-Analog Converters (DAC), or any other input/output blocks. The input/output circuits 204 can be configured to receive and/or transmit signals from and/or to a circuit outside of the multi-chip device. The IP core circuits 206 can include memory controllers (such as double data rate (DDR) memory controllers, high bandwidth memory (HBM) memory controllers, or the like), peripheral component interconnect express (PCIe) interfaces, cache coherent interconnect for accelerators (CCIX) interfaces, Ethernet cores (such as a media address controller (MAC) or the like), forward error correction (FEC) blocks, and/or any other hardened circuit. Any of the input/output circuits 204 and/or IP core circuits 206 can be programmable.

The NoC 210 includes a programmable network 212 and a NoC peripheral interconnect (NPI) 214. The programmable network 212 communicatively couples subsystems and any other circuits of the base IC on the base chip 102 together. The programmable network 212 includes NoC packet switches and interconnect lines connecting the NoC packet switches. Each NoC packet switch performs switching of NoC packets in the programmable network 212. The programmable network 212 has interface circuits at the edges of the programmable network 212. The interface circuits include NoC master units (NMUs) and NoC slave units (NSUs). Each NMU is an ingress circuit that connects a master circuit to the programmable network 212, and each NSU is an egress circuit that connects the programmable network 212 to a slave endpoint circuit. NMUs are communicatively coupled to NSUs via the NoC packet switches and interconnect lines of the programmable network 212. The NoC packet switches are connected to each other and to the NMUs and NSUs through the interconnect lines to implement a plurality of physical channels in the programmable network 212. The NoC packet switches, NMUs, and NSUs include register blocks that determine the operation of the respective NoC packet switch, NMU, or NSU.

The NPI 214 includes circuitry to write to register blocks that determine the functionality of the NMUs, NSUs, and NoC packet switches. The NPI 214 includes a peripheral interconnect coupled to the register blocks for programming thereof to set functionality. The register blocks in the NMUs, NSUs, and NoC packet switches of the programmable network 212 support interrupts, quality of service (QoS), error handling and reporting, transaction control, power management, and address mapping control. The NPI 214 can include an NPI root node residing on the processing system 202 (e.g., a platform management controller (PMC) of the processing system 202), interconnected NPI switches connected to the NPI root node, and protocol blocks connected to the interconnected NPI switches and a corresponding register block. The NPI 214 may be used to program any programmable circuit of the base IC on the base chip 102. For example, the NPI 214 may be used to program any input/output circuit 204 and/or IP core circuit 206 that is programmable.

The Z-interface 232 can include active circuits, such as buffers to drive signals. The Z-interface 232 provides an interface, including through metal lines/pads and vias in metallization layers, for the processing system 202, input/output circuits 204, IP core circuits 206, and programmable network 212 of the NoC 210 to chips overlying the base chip 102 and/or a substrate (e.g., package substrate) underlying the base chip 102. Additionally, the Z-interface 232 can provide a pass-through interface through the base chip 102.

The various subsystems and circuits of the base IC on the base chip 102 can be communicatively coupled. As illustrated, the processing system 202, input/output circuits 204, and IP core circuits 206 are connected to the NoC 210 (e.g., to the programmable network 212), and hence, are communicatively coupled to each other. The processing system 202 is further connected to the NPI 214 for communicating configuration data to various programmable components on the base chip 102. The processing system 202 is further connected to the programmable network 212 of the NoC 210 for communicating configuration data to chips overlying the base chip 102. The programmable network 212 of the NoC 210 is connected to the Z-interface 232 such that data, such as transactional data and configuration data, can be communicated through the Z-interface 232 to another chip. Each of the processing system 202, input/output circuits 204, and IP core circuits 206 is connected to the Z-interface 232 for communications with, e.g., programmable logic in the PL ICs 224, 226, 228 in overlying fabric chips 104, 106. Other communication mechanisms, such as direct connections, between the various subsystems and circuits may be implemented.

The PL IC 224-228 on each of the fabric chips 104-108 includes one or more programmable logic region. The programmable logic region is logic circuitry that may be programmed to perform specified functions. The programmable logic region can include any number or arrangement of programmable tiles. As an example, the programmable logic region may be implemented as fabric of an FPGA. For example, the programmable logic region can include any number of configurable logic blocks (CLBs), look-up tables (LUTs), digital signal processing blocks (DSPs), random access memory blocks (BRAMs), etc. Each of the programmable tiles (e.g., CLBs, LUTs, DSPs, BRAMs, etc.) can include one or more programmable interconnect elements. The various respective types of programmable tiles can be arranged in rows and/or columns, and the associate programmable interconnect elements can be connected to neighboring programmable logic elements in a same column and row, for example. The programmable interconnect element can form an interconnect network of the programmable logic region. Any logic and connections can be implemented by the programmable logic region by programming or configuring any of the programmable tiles of the programmable logic region.

The Z-interface 234-238 on each of the fabric chips 104-108 can include active circuits, such as buffers to drive signals and/or selection circuits. The Z-interface 234-238 provides an interface, including through metal lines and vias in metallization layers, for the respective PL IC 224-228 to communicate with chips overlying and/or underlying the respective fabric chip 104-108. Additionally, the Z-interface 234-238 can provide a pass-through interface through the respective fabric chip 104-108. Examples of columns of broken via pillars with staggered via pillars, which can implement a pass-through interface, are described in more detail below. Configuration data for the PL ICs 224-228 can be transmitted through passive connections through Z-interfaces 234-238, for example.

Each PL IC 224-228 can also include a configuration interconnect that includes a configuration Frame (CFRAME) driver. The CFRAME driver may be or include control logic to communicate configuration data (such as a bitstream) to configure programmable logic. Each programmable logic region is configurable or programmable by configuration data received via the Z-interface 232, a corresponding Z-interface 234-238 of the respective fabric chip 104-108, and any intervening Z-interface 234, 236. For example, the processing system 202 (e.g., a PMC of the processing system 202) can transmit configuration data via the programmable network 212 of the NoC 210 and the Z-interface 232 to a respective PL IC 224-228. In some examples, a configuration interconnect (e.g., including a CFRAME driver) can direct the configuration data to appropriate programmable tiles and can control configuring such programmable tiles.

Figure 3:
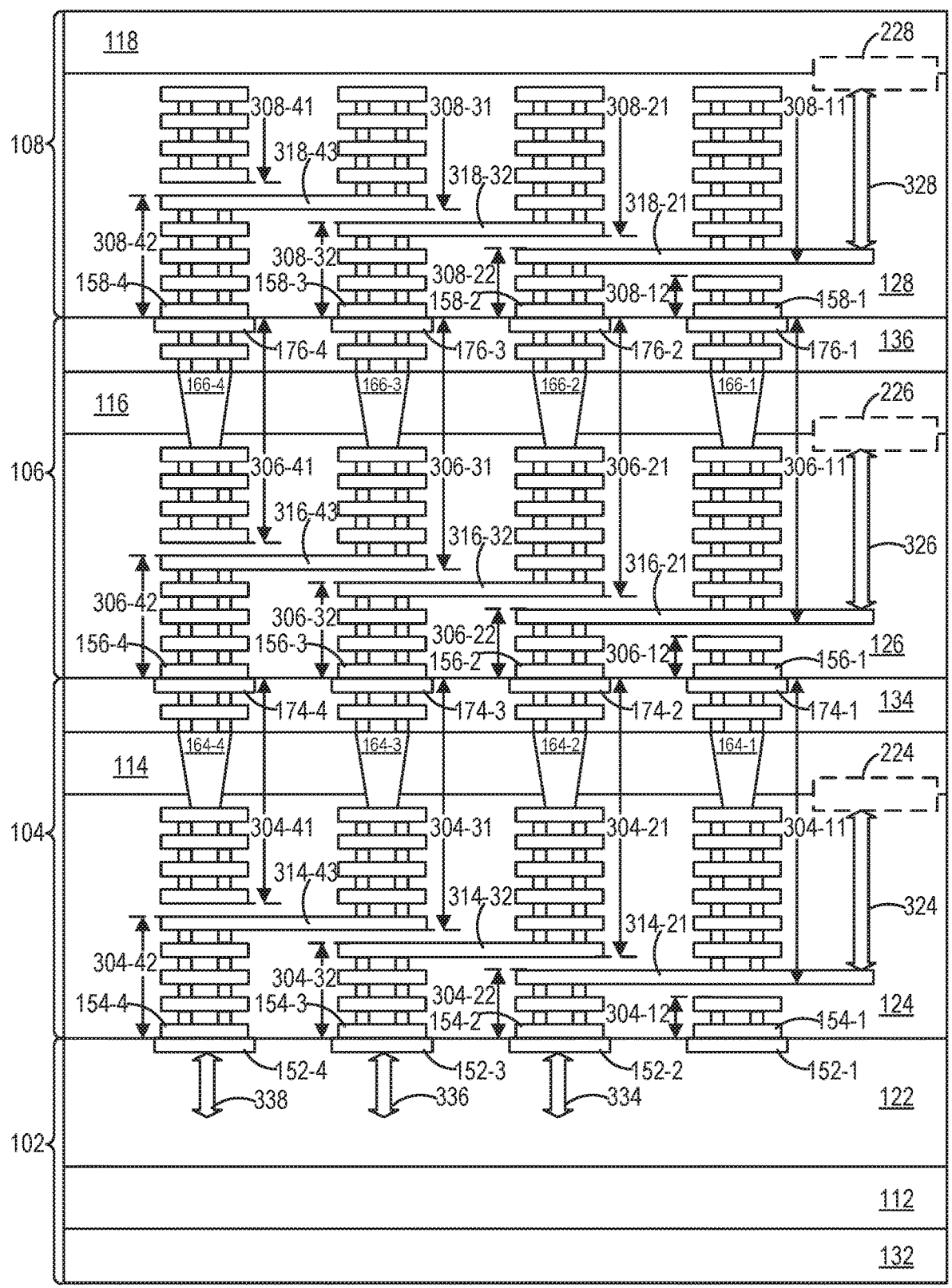
FIG. 3 depicts the chip stack of FIG. 1 with a simplified structure of at least respective portions of Z-interfaces of chips according to some examples.

FIG. 3 illustrates the chip stack of FIG. 1 with a simplified structure of at least respective portions of Z-interfaces 234, 236, 238 of the fabric chips 104, 106, 108 according to some examples. Although described with respect to fabric chips 104, 106, 108, aspects of the described Z-interfaces can be applicable to the Z-interface 232 of the base chip 102. FIG. 3 illustrates the fabric chips 104-108 oriented front side facing towards the base chip 102.

The Z-interface 234 of the fabric chip 104 includes a first broken via pillar comprising first and second continuous via pillar portions 304-11, 304-12, a second broken via pillar comprising first and second continuous via pillar portions 304-21, 304-22, a third broken via pillar comprising first and second continuous via pillar portions 304-31, 304-32, and a fourth broken via pillar comprising first and second continuous via pillar portions 304-41, 304-42. Although not specifically identified in FIG. 3, reference is made to the first broken via pillar 304-1, second broken via pillar 304-2, third broken via pillar 304-3, and fourth broken via pillar 304-4.

The first continuous via pillar portion 304-11 of the first broken via pillar 304-1 includes metal lines/pads (including backside bond pad 174-1) in the backside dielectric layer(s) 134, a backside TSV 164-1 through the semiconductor substrate 114, and metal lines/pads in the front side dielectric layer(s) 124. The second continuous via pillar portion 304-12 of the first broken via pillar 304-1 includes metal lines/pads (including front side bond pad 154-1) in the front side dielectric layer(s) 124. The first continuous via pillar portion 304-21 of the second broken via pillar 304-2 includes metal lines/pads (including backside bond pad 174-2) in the backside dielectric layer(s) 134, a backside TSV 164-2 through the semiconductor substrate 114, and metal lines/pads in the front side dielectric layer(s) 124. The second continuous via pillar portion 304-22 of the second broken via pillar 304-2 includes metal lines/pads (including front side bond pad 154-2) in the front side dielectric layer(s) 124. The first continuous via pillar portion 304-31 of the third broken via pillar 304-3 includes metal lines/pads (including backside bond pad 174-3) in the backside dielectric layer(s) 134, a backside TSV 164-3 through the semiconductor substrate 114, and metal lines/pads in the front side dielectric layer(s) 124. The second continuous via pillar portion 304-32 of the third broken via pillar 304-3 includes metal lines/pads (including front side bond pad 154-3) in the front side dielectric layer(s) 124. The first continuous via pillar portion 304-41 of the fourth broken via pillar 304-4 includes metal lines/pads (including backside bond pad 174-4) in the backside dielectric layer(s) 134, a backside TSV 164-4 through the semiconductor substrate 114, and metal lines/pads in the front side dielectric layer(s) 124. The second continuous via pillar portion 304-42 of the fourth broken via pillar 304-4 includes metal lines/pads (including front side bond pad 154-4) in the front side dielectric layer(s) 124.

The metal lines/pads, vias, and TSV in each broken via pillar 304-1, 304-2, 304-3, 304-4 (including in the respective first continuous via pillar portion and the respective second continuous via pillar portion) are aligned within the respective broken via pillar in a direction normal to the front side surface of the semiconductor substrate 114. Even more generally, the first continuous via pillar portion and the second continuous via pillar portion of a respective broken via pillar 304-1, 304-2, 304-3, 304-4 are aligned within the respective broken via pillar in a direction normal to the front side surface of the semiconductor substrate 114. A first continuous via pillar portion in this example generally includes vertically stacked backside bond pad, metal line(s) and/or via(s) in backside dielectric layer(s), TSV, and metal line(s) and/or via(s) in front side dielectric layer(s) that are continuously connected together. A second continuous via pillar portion in this example generally includes vertically stacked metal line(s) and/or via(s) in front side dielectric layer(s) and front side bond pad that are continuously connected together.

The first continuous via pillar portion is not connected to the second continuous via pillar portion within the respective broken via pillar 304-1, 304-2, 304-3, 304-4. Generally, each of the broken via pillars 304-1, 304-2, 304-3, 304-4 is not continuously connected through metallizations of the respective front side dielectric layer(s) 124 of the fabric chip 104. More specifically, the respective first continuous via pillar portion 304-11, 304-21, 304-31, 304-41 of the broken via pillar 304-1, 304-2, 304-3, 304-4 is not connected to the respective second continuous via pillar portion 304-12, 304-22, 304-32, 304-42 of the broken via pillar 304-1, 304-2, 304-3, 304-4. For example, no metal feature, such as a via, directly connects to and between bridges 314-21, 314-32 in the second broken via pillar 304-2, and no metal feature, such as a via, directly connects to and between bridges 314-32, 314-43 in the third broken via pillar 304-3.

The Z-interfaces 236, 238 of the fabric chips 106, 108 include similar broken via pillars as the Z-interface 234 of the fabric chip 104. The Z-interface 236 of the fabric chip 106 includes a first broken via pillar comprising first and second continuous via pillar portions 306-11, 306-12, a second broken via pillar comprising first and second continuous via pillar portions 306-21, 306-22, a third broken via pillar comprising first and second continuous via pillar portions 306-31, 306-32, and a fourth broken via pillar comprising first and second continuous via pillar portions 306-41, 306-42. Although not specifically identified in FIG. 3, reference is made to the first broken via pillar 306-1, second broken via pillar 306-2, third broken via pillar 306-3, and fourth broken via pillar 306-4. The broken via pillars 306-1, 306-2, 306-3, 306-4 are configured in the fabric chip 106 the same as the broken via pillars 304-1, 304-2, 304-3, 304-4 are configured in the fabric chip 104.

The Z-interface 238 of the fabric chip 108 includes a first broken via pillar comprising first and second continuous via pillar portions 308-11, 308-12, a second broken via pillar comprising first and second continuous via pillar portions 308-21, 308-22, a third broken via pillar comprising first and second continuous via pillar portions 308-31, 308-32, and a fourth broken via pillar comprising first and second continuous via pillar portions 308-41, 308-42. Although not specifically identified in FIG. 3, reference is made to the first broken via pillar 308-1, second broken via pillar 308-2, third broken via pillar 308-3, and fourth broken via pillar 308-4. The broken via pillars 308-1, 308-2, 308-3, 308-4 are configured in the fabric chip 108 the same as the broken via pillars 304-1, 304-2, 304-3, 304-4 are configured in the fabric chip 104, except without respective TSVs and metal lines/pads and vias in a backside dielectric layer(s) since the fabric chip 108 does not undergo backside processing. A person having ordinary skill in the art will readily understand the relation between the previous discussion regarding components of the fabric chip 104 and components of the fabric chips 106, 108 illustrated in FIG. 3.

The broken via pillars are aligned in columns across the fabric chips 104-108. The first broken via pillars 304-1, 306-1, 308-1 in the fabric chips 104-108 are aligned in a first column. The second broken via pillars 304-2, 306-2, 308-2 in the fabric chips 104-108 are aligned in a second column. The third broken via pillars 304-3, 306-3, 308-3 in the fabric chips 104-108 are aligned in a third column. The fourth broken via pillars 304-4, 306-4, 308-4 in the fabric chips 104-108 are aligned in a fourth column.

With this alignment, various continuous via pillar portions on different chips are connected by bond pads that are bonded together at a bonding interface. The first continuous via pillar portion 304-11 on the fabric chip 104 is connected to the second continuous via pillar portion 306-12 on the fabric chip 106 by the backside bond pad 174-1 being bonded to the front side bond pad 156-1. The first continuous via pillar portion 304-21 on the fabric chip 104 is connected to the second continuous via pillar portion 306-22 on the fabric chip 106 by the backside bond pad 174-2 being bonded to the front side bond pad 156-2. The first continuous via pillar portion 304-31 on the fabric chip 104 is connected to the second continuous via pillar portion 306-32 on the fabric chip 106 by the backside bond pad 174-3 being bonded to the front side bond pad 156-3. The first continuous via pillar portion 304-41 on the fabric chip 104 is connected to the second continuous via pillar portion 306-42 on the fabric chip 106 by the backside bond pad 174-4 being bonded to the front side bond pad 156-4.

The first continuous via pillar portion 306-11 on the fabric chip 106 is connected to the second continuous via pillar portion 308-12 on the fabric chip 108 by the backside bond pad 176-1 being bonded to the front side bond pad 158-1. The first continuous via pillar portion 306-21 on the fabric chip 106 is connected to the second continuous via pillar portion 308-22 on the fabric chip 108 by the backside bond pad 176-2 being bonded to the front side bond pad 158-2. The first continuous via pillar portion 306-31 on the fabric chip 106 is connected to the second continuous via pillar portion 308-32 on the fabric chip 108 by the backside bond pad 176-3 being bonded to the front side bond pad 158-3. The first continuous via pillar portion 306-41 on the fabric chip 106 is connected to the second continuous via pillar portion 308-42 on the fabric chip 108 by the backside bond pad 176-4 being bonded to the front side bond pad 158-4.

Respective bridges are disposed extending between and connecting first continuous via pillar portions of a respective broken via pillar in a column and a second continuous via pillar portion of a respective different broken via pillar in a different column within a chip. Each bridge in the illustrated example is a metal line disposed in the respective front side dielectric layer(s). A bridge can include multiple lines/pads and/or vias and may be disposed in the backside dielectric layer(s), for example.

A second-to-first bridge 314-21 forms at least respective parts of, extends between, and connects the second continuous via pillar portion 304-22 of the second broken via pillar 304-2 to the first continuous via pillar portion 304-11 of the first broken via pillar 304-1. A third-to-second bridge 314-32 forms at least respective parts of, extends between, and connects the second continuous via pillar portion 304-32 of the third broken via pillar 304-3 to the first continuous via pillar portion 304-21 of the second broken via pillar 304-2. A fourth-to-third bridge 314-43 forms at least respective parts of, extends between, and connects the second continuous via pillar portion 304-42 of the fourth broken via pillar 304-4 to the first continuous via pillar portion 304-31 of the third broken via pillar 304-3.

A second-to-first bridge 316-21 forms at least respective parts of, extends between, and connects the second continuous via pillar portion 306-22 of the second broken via pillar 306-2 to the first continuous via pillar portion 306-11 of the first broken via pillar 306-1. A third-to-second bridge 316-32 forms at least respective parts of, extends between, and connects the second continuous via pillar portion 306-32 of the third broken via pillar 306-3 to the first continuous via pillar portion 306-21 of the second broken via pillar 306-2. A fourth-to-third bridge 316-43 forms at least respective parts of, extends between, and connects the second continuous via pillar portion 306-42 of the fourth broken via pillar 306-4 to the first continuous via pillar portion 306-31 of the third broken via pillar 306-3.

A second-to-first bridge 318-21 forms at least respective parts of, extends between, and connects the second continuous via pillar portion 308-22 of the second broken via pillar 308-2 to the first continuous via pillar portion 308-11 of the first broken via pillar 308-1. A third-to-second bridge 318-32 forms at least respective parts of, extends between, and connects the second continuous via pillar portion 308-32 of the third broken via pillar 308-3 to the first continuous via pillar portion 308-21 of the second broken via pillar 308-2. A fourth-to-third bridge 318-43 forms at least respective parts of, extends between, and connects the second continuous via pillar portion 308-42 of the fourth broken via pillar 308-4 to the first continuous via pillar portion 308-31 of the third broken via pillar 308-3.

Each first continuous via pillar portion and second continuous via pillar portion that are connected together by a bridge form a staggered via pillar within the respective chip. The first continuous via pillar portion 304-11, second-to-first bridge 314-21, and second continuous via pillar portion 304-22 form a staggered via pillar. The first continuous via pillar portion 304-21, third-to-second bridge 314-32, and second continuous via pillar portion 304-32 form a staggered via pillar. The first continuous via pillar portion 304-31, fourth-to-third bridge 314-43, and second continuous via pillar portion 304-42 form a staggered via pillar.

The first continuous via pillar portion 306-11, second-to-first bridge 316-21, and second continuous via pillar portion 306-22 form a staggered via pillar. The first continuous via pillar portion 306-21, third-to-second bridge 316-32, and second continuous via pillar portion 306-32 form a staggered via pillar. The first continuous via pillar portion 306-31, fourth-to-third bridge 316-43, and second continuous via pillar portion 306-42 form a staggered via pillar.

The first continuous via pillar portion 308-11, second-to-first bridge 318-21, and second continuous via pillar portion 308-22 form a staggered via pillar. The first continuous via pillar portion 308-21, third-to-second bridge 318-32, and second continuous via pillar portion 308-32 form a staggered via pillar. The first continuous via pillar portion 308-31, fourth-to-third bridge 318-43, and second continuous via pillar portion 308-42 form a staggered via pillar.

Additionally, the second-to-first bridge 314-21, 316-21, 318-21 is connected to an input or output node of an active circuit (e.g., the PL IC 224, 226, 228) of the respective fabric chip 104-108. As illustrated, the second-to-first bridge 314-21 is connected to the PL IC 224 through interconnections 324 (e.g., metal lines/pads and/or vias); the second-to-first bridge 316-21 is connected to the PL IC 226 through interconnections 326; and the second-to-first bridge 318-21 is connected to the PL IC 228 through interconnections 328. The node of the active circuit to which a second-to-first bridge is connected may be an input node, an output node, or a bidirectional node. Hence, signals may be received and/or output by the active circuit to the second-to-first bridge.

The base chip 102 is capable of transmitting and/or receiving signals from the active circuits (e.g., PL ICs 224-228) on the fabric chips 104-108 via front side bond pads 152-2, 152-3, 152-4. Based on the hardware configuration of the fabric chips 104-108, the front side bond pad 152-2, 152-3, 152-4 to or from which a signal is transmitted or received can determine the circuit on which of the fabric chips 104-108 that receives or transmits the signal. In the illustrated example, a first signal 334 on the front side bond pad 152-2 is communicated with the PL IC 224 on the fabric chip 104; a second signal 336 on the front side bond pad 152-3 is communicated with the PL IC 226 on the fabric chip 106; and a third signal 338 on the front side bond pad 152-4 is communicated with the PL IC 228 on the fabric chip 108.

The front side bond pad 152-2 is connected to the front side bond pad 154-2, which is part of the second column and further is part of the second continuous via pillar portion 304-22 of the second broken via pillar 304-2. The front side bond pad 152-3 is connected to the front side bond pad 154-3, which is part of the third column and further is part of the second continuous via pillar portion 304-32 of the third broken via pillar 304-3. The front side bond pad 152-4 is connected to the front side bond pad 154-4, which is part of the fourth column and further is part of the second continuous via pillar portion 304-42 of the fourth broken via pillar 304-4.

A circuit of the base chip 102 can transmit or receive the first signal 334 at the front side bond pad 152-2. The first signal 334 is communicated through the second column (e.g., the second continuous via pillar portion 304-22 of the second broken via pillar 304-2), the second-to-first bridge 314-21, and the interconnections 324 to the PL IC 224. The first signal 334 may further be communicated to a circuit of the fabric chip 106 through the first column (e.g., through the first continuous via pillar portion 304-11 of the first broken via pillar 304-1 and the second continuous via pillar portion 306-12 of the first broken via pillar 306-1). In some examples, the first column of first broken via pillars 304-1, 306-1, 308-1 can be omitted. In such examples, the first signal 334 is not communicated to the fabric chip 106 through the first continuous via pillar portion 304-11 and the second continuous via pillar portion 306-12.

A circuit of the base chip 102 can transmit or receive the second signal 336 at the front side bond pad 152-3. The second signal 336 is communicated through the third column (e.g., the second continuous via pillar portion 304-32 of the third broken via pillar 304-3), the third-to-second bridge 314-32, and the second column (e.g., the first continuous via pillar portion 304-21 of the second broken via pillar 304-2) within the fabric chip 104. Hence, the second signal 336 is communicated and translated from the third column to the second column by a staggered via pillar in the fabric chip 104. The second signal 336 is further communicated through the second column (e.g., the second continuous via pillar portion 306-22 of the second broken via pillar 306-2), the second-to-first bridge 316-21, and the interconnections 326 to the PL IC 226. The second signal 336 may further be communicated to a circuit of the fabric chip 108 through the first column (e.g., through the first continuous via pillar portion 306-11 of the first broken via pillar 306-1 and the second continuous via pillar portion 308-12 of the first broken via pillar 308-1). In some examples, the first column of first broken via pillars 304-1, 306-1, 308-1 can be omitted. In such examples, the second signal 336 is not communicated to the fabric chip 108 through the first continuous via pillar portion 306-11 and the second continuous via pillar portion 308-12.

A circuit of the base chip 102 can transmit or receive the third signal 338 at the front side bond pad 152-4. The third signal 338 is communicated through the fourth column (e.g., the second continuous via pillar portion 304-42 of the fourth broken via pillar 304-4), the fourth-to-third bridge 314-43, and the third column (e.g., the first continuous via pillar portion 304-31 of the third broken via pillar 304-3) within the fabric chip 104. Hence, the third signal 338 is communicated and translated from the fourth column to the third column by a staggered via pillar in the fabric chip 104. The third signal 338 is further communicated through the third column (e.g., the second continuous via pillar portion 306-32 of the third broken via pillar 306-3), the third-to-second bridge 316-32, and the second column (e.g., the first continuous via pillar portion 306-21 of the second broken via pillar 306-2) within the fabric chip 106. Hence, the third signal 338 is communicated and translated from the third column to the second column by a staggered via pillar in the fabric chip 106. The third signal 338 is further communicated through the second column (e.g., the second continuous via pillar portion 308-22 of the second broken via pillar 308-2), the second-to-first bridge 318-21, and the interconnections 328 to the PL IC 228.

As illustrated by the foregoing, each of the active circuits (e.g., PL ICs 224-228) receive signals from or transmit signals to the base chip 102 through the same second column of second broken via pillars 304-2, 306-2, 308-2 within the respective fabric chip 104-108. Hence, the PL ICs 224-228 can have a same hardware layout where the PL ICs 224-228 communicate different signals with the base chip 102 at a same respective location within the respective fabric chip 104-108 without the other PL ICs 224-228 also receiving that signal.

Staggered via pillars can enable different chips in a chip stack to have a same IC and hardware, which can reduce the number of variants of chips to be designed and taped out. Even further, programming of communication interfaces between chips can be obviated by implementing staggered via pillars in some examples.

A person having ordinary skill in the art will readily understand that the illustration of FIG. 3 is simplified. In some examples, the front side dielectric layer(s) 122-128 of the respective chips 102-108 each is or includes a group of dielectric layers, such as eighteen or more dielectric layers, e.g., depending on a technology node of the chips 102-108. Further, the front side dielectric layer(s) 122-128 can each have or include eighteen metal layers (e.g., a M0 layer through M17 layer) in some examples, although the number of metal layers can vary, such as depending on technology node of the chips. The various bridges and/or metal lines can be in any of the metal layers in some examples.

Figure 4:
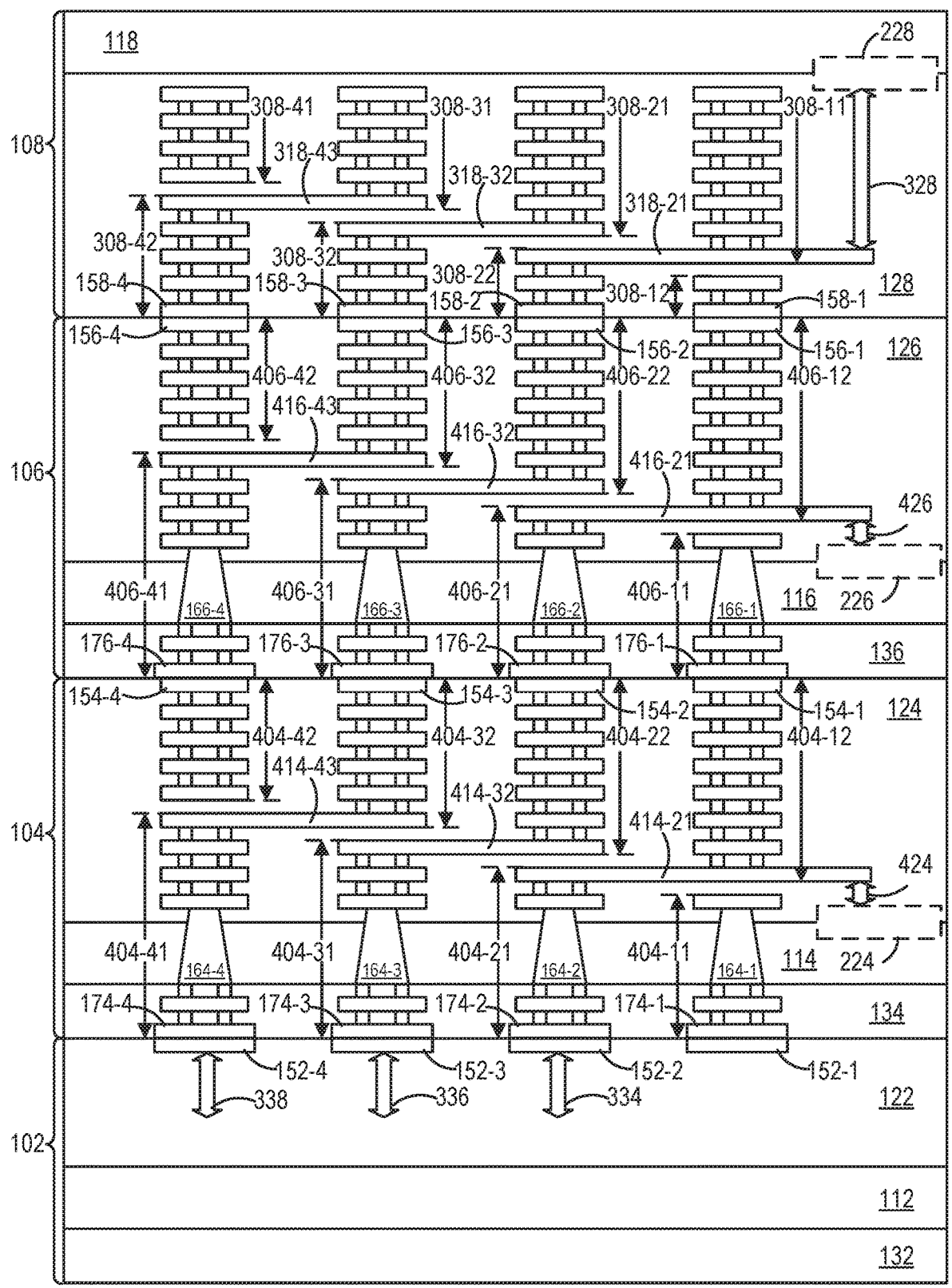
FIG. 4 depicts another chip stack with a simplified structure of at least respective portions of Z-interfaces of chips according to some examples.

FIG. 4 illustrates a chip stack with a simplified structure of at least respective portions of Z-interfaces 234, 236, 238 of the fabric chips 104, 106, 108 according to some examples. Although described with respect to fabric chips 104, 106, 108, aspects of the described Z-interfaces can be applicable to the Z-interface 232 of the base chip 102. FIG. 4 illustrates intermediate fabric chips 104, 106 oriented front side facing away from the base chip 102, and the distal fabric chip 108 oriented front side facing towards the base chip 102.

A person having ordinary skill in the art will readily understand the applicability of the description above (with respect to FIG. 3) to the chip stack of FIG. 4. Hence, detailed description of FIG. 4 may be omitted in certain aspects.

Generally, the Z-interfaces 234, 236 of the fabric chips 104, 106 include broken via pillars. The Z-interface 234 of the fabric chip 104 includes a first broken via pillar comprising first and second continuous via pillar portions 404-11, 404-12, a second broken via pillar comprising first and second continuous via pillar portions 404-21, 404-22, a third broken via pillar comprising first and second continuous via pillar portions 404-31, 404-32, and a fourth broken via pillar comprising first and second continuous via pillar portions 404-41, 404-42. Although not specifically identified in FIG. 4, reference is made to the first broken via pillar 404-1, second broken via pillar 404-2, third broken via pillar 404-3, and fourth broken via pillar 404-4.

The Z-interface 236 of the fabric chip 106 includes a first broken via pillar comprising first and second continuous via pillar portions 406-11, 406-12, a second broken via pillar comprising first and second continuous via pillar portions 406-21, 406-22, a third broken via pillar comprising first and second continuous via pillar portions 406-31, 406-32, and a fourth broken via pillar comprising first and second continuous via pillar portions 406-41, 406-42. Although not specifically identified in FIG. 4, reference is made to the first broken via pillar 406-1, second broken via pillar 406-2, third broken via pillar 406-3, and fourth broken via pillar 406-4.

The broken via pillars are aligned in columns across the fabric chips 104-108. The first broken via pillars 404-1, 406-1, 308-1 in the fabric chips 104-108 are aligned in a first column. The second broken via pillars 404-2, 406-2, 308-2 in the fabric chips 104-108 are aligned in a second column. The third broken via pillars 404-3, 406-3, 308-3 in the fabric chips 104-108 are aligned in a third column. The fourth broken via pillars 404-4, 406-4, 308-4 in the fabric chips 104-108 are aligned in a fourth column.

Respective bridges are disposed extending between and connecting first continuous via pillar portions of a respective broken via pillar in a column and a second continuous via pillar portion of a respective different broken via pillar in a different column within a chip. A second-to-first bridge 414-21 forms at least respective parts of, extends between, and connects the first continuous via pillar portion 404-21 of the second broken via pillar 404-2 to the second continuous via pillar portion 404-12 of the first broken via pillar 404-1. A third-to-second bridge 414-32 forms at least respective parts of, extends between, and connects the first continuous via pillar portion 404-31 of the third broken via pillar 404-3 to the second continuous via pillar portion 404-22 of the second broken via pillar 404-2. A fourth-to-third bridge 414-43 forms at least respective parts of, extends between, and connects the first continuous via pillar portion 404-41 of the fourth broken via pillar 404-4 to the second continuous via pillar portion 404-32 of the third broken via pillar 404-3.

A second-to-first bridge 416-21 forms at least respective parts of, extends between, and connects the first continuous via pillar portion 406-21 of the second broken via pillar 406-2 to the second continuous via pillar portion 406-12 of the first broken via pillar 406-1. A third-to-second bridge 416-32 forms at least respective parts of, extends between, and connects the first continuous via pillar portion 406-31 of the third broken via pillar 406-3 to the second continuous via pillar portion 406-22 of the second broken via pillar 406-2. A fourth-to-third bridge 416-43 forms at least respective parts of, extends between, and connects the first continuous via pillar portion 406-41 of the fourth broken via pillar 406-4 to the second continuous via pillar portion 406-32 of the third broken via pillar 406-3.

Each first continuous via pillar portion and second continuous via pillar portion that are connected together by a bridge form a staggered via pillar within the respective chip. The second continuous via pillar portion 404-12, second-to-first bridge 414-21, and first continuous via pillar portion 404-21 form a staggered via pillar. The second continuous via pillar portion 404-22, third-to-second bridge 414-32, and first continuous via pillar portion 404-31 form a staggered via pillar. The second continuous via pillar portion 404-32, fourth-to-third bridge 414-43, and first continuous via pillar portion 404-41 form a staggered via pillar. The second continuous via pillar portion 406-12, second-to-first bridge 416-21, and first continuous via pillar portion 406-21 form a staggered via pillar. The second continuous via pillar portion 406-22, third-to-second bridge 416-32, and first continuous via pillar portion 406-31 form a staggered via pillar. The second continuous via pillar portion 406-32, fourth-to-third bridge 416-43, and first continuous via pillar portion 406-41 form a staggered via pillar.

Additionally, the second-to-first bridge 414-21, 416-21 is connected to an input or output node of an active circuit (e.g., the PL IC 224, 226) of the respective fabric chip 104, 106. As illustrated, the second-to-first bridge 414-21 is connected to the PL IC 224 through interconnections 424 (e.g., metal lines/pads and/or vias), and the second-to-first bridge 416-21 is connected to the PL IC 226 through interconnections 426. The node of the active circuit to which a second-to-first bridge is connected may be an input node, an output node, or a bidirectional node. Hence, signals may be received and/or output by the active circuit to the second-to-first bridge.

Figure 5:
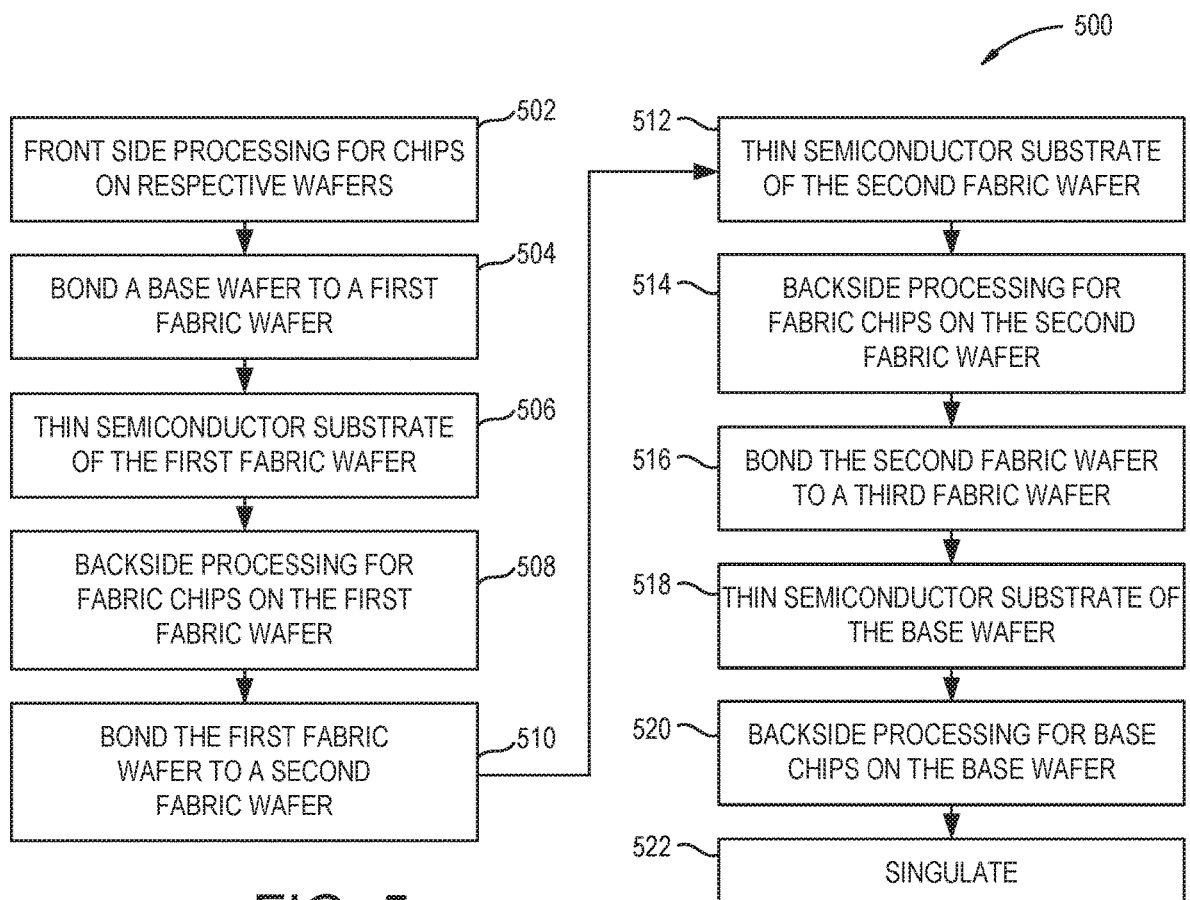
FIG. 5 is a flowchart of a method of forming the multi-chip device of FIG. 1 according to some examples.

FIG. 5 is a flowchart of a method 500 of forming the multi-chip device of FIGS. 1 and 3 according to some examples. A person having ordinary skill in the art will readily understand modifications to achieve other multi-chip devices, such as shown in FIG. 4. The processing of the method 500 of FIG. 5 is generally described, and a person having ordinary skill in the art will readily understand the more specific processing that can be performed. The more specific processing can be according to any semiconductor processing for forming an IC on substrate, which is to be singulated into a chip. For ease of description herein, a wafer on which one or more base chips 102 are formed is referred to as a base wafer, and a wafer on which one or more fabric chips 104, 106, 108 are formed is referred to as a fabric wafer. Any wafer can be any shape and/or size.

At block 502, front side processing for chips on the respective wafers is performed. For example, front side processing of each semiconductor substrate 112, 114, 116, 118 (e.g., wafer) can include forming devices (e.g., transistors 142, 144, 146, 148) in and/or on the front surface of the semiconductor substrate 112, 114, 116, 118, and forming front side dielectric layer(s) 122, 124, 126, 128 with metallizations and front side bond pads 152, 154, 156, 158 on the front surface of the semiconductor substrate 112, 114, 116, 118. Multiple base chips 102 can be formed on a base wafer. Multiple fabric chips 104, 106, or 108 can be formed on each of a plurality of fabric wafers. The front side processing can, for example, form portions of the broken via pillars of Z-interfaces that are on and/or in the respective semiconductor substrate and front side dielectric layer(s).

At block 504, a base wafer is bonded to a first fabric wafer, such as front side to front side bonding as shown in FIG. 1. As a result of the bonding, a front side of a base chip 102 is bonded to a front side of a fabric chip 104, as shown in FIG. 1. The bonding can be hybrid bonding, such as bonding front side bond pads 152 on the base wafer to front side bond pads 154 on the first fabric wafer, and bonding the exterior surface of the front side dielectric layer(s) 122 on the base wafer to the exterior surface of the front side dielectric layer(s) 124 on the first fabric wafer.

At block 506, the semiconductor substrate of the first fabric wafer is thinned from a backside of the first fabric wafer. As show in FIG. 1, the semiconductor substrate 114 of the fabric chip 104 is thinned from the backside. The thinning can be by a chemical mechanical polish (CMP) or other appropriate process. At block 508, backside processing for fabric chips on the first fabric wafer is performed. As illustrated by FIG. 1, the backside processing can include forming backside TSVs 164 through the semiconductor substrate 114 of the first fabric wafer and connecting to metallization in the front side dielectric layer(s) 124 on the first fabric wafer. The backside processing can further include forming backside dielectric layer(s) 134 with metallizations and backside bond pads 174 on the backside of the semiconductor substrate 114. The metallizations in the backside dielectric layer(s) 134 can be connected to the metallizations in the front side dielectric layer(s) 124 through the backside TSVs 164. Generally, the formation of backside TSVs and metallizations in the backside dielectric layer(s) can form the broken via pillars of Z-interfaces that are on and/or in the respective semiconductor substrate and backside dielectric layer(s).

At block 510, the first fabric wafer is bonded to a second fabric wafer, such as backside to front side bonding as shown in FIG. 1. As a result of the bonding, a backside of a fabric chip 104 is bonded to a front side of a fabric chip 106, as shown in FIG. 1. The bonding can be hybrid bonding, such as bonding backside bond pads 174 on the first fabric wafer to front side bond pads 156 on the second fabric wafer, and bonding the exterior surface of the backside dielectric layer(s) 134 on the first fabric wafer to the exterior surface of the front side dielectric layer(s) 126 on the second fabric wafer.

At block 512, the semiconductor substrate of the second fabric wafer is thinned from a backside of the second fabric wafer, like described with respect to block 506. As show in FIG. 1, the semiconductor substrate 116 of the fabric chip 106 is thinned from the backside.

At block 514, backside processing for fabric chips on the second fabric wafer is performed, like described with respect to block 508. As illustrated by FIG. 1, the backside processing can include forming backside TSVs 166 through the semiconductor substrate 116 of the second fabric wafer and connecting to metallization in the front side dielectric layer(s) 126 on the second fabric wafer. The backside processing can further include forming backside dielectric layer(s) 136 with metallizations and backside bond pads 176 on the backside of the semiconductor substrate 116. The metallizations in the backside dielectric layer(s) 136 can be connected to the metallizations in the front side dielectric layer(s) 126 through the backside TSVs 166.

At block 516, the second fabric wafer is bonded to a third fabric wafer, such as backside to front side bonding as shown in FIG. 1. As a result of the bonding, a backside of a fabric chip 106 is bonded to a front side of a fabric chip 108, as shown in FIG. 1. The bonding can be hybrid bonding, such as bonding backside bond pads 176 on the second fabric wafer to front side bond pads 158 on the third fabric wafer, and bonding the exterior surface of the backside dielectric layer(s) 136 on the second fabric wafer to the exterior surface of the front side dielectric layer(s) 128 on the third fabric wafer.

At block 518, the semiconductor substrate of the base wafer is thinned from a backside of the base wafer, like described with respect to block 506. As show in FIG. 1, the semiconductor substrate 112 of the base chip 102 is thinned from the backside.

At block 520, backside processing for base chips on the base wafer is performed, like described with respect to block 508. As illustrated by FIG. 1, the backside processing can include forming backside TSVs 162 through the semiconductor substrate 112 of the base wafer and connecting to metallization in the front side dielectric layer(s) 122 on the base wafer. The backside processing can further include forming backside dielectric layer(s) 132 with metallizations and exterior connector backside pads 172 on the backside of the semiconductor substrate 112. The metallizations in the backside dielectric layer(s) 132 can be connected to the metallizations in the front side dielectric layer(s) 122 through the backside TSVs 162. The backside processing for the base chips 102 can further include forming the passivation layer 180 and external connectors 182. At block 522, the bonded wafers are singulated (e.g., by sawing) to separate individual multi-chip devices that have been formed. Each of the multi-chip devices can be as shown in FIG. 1.

The various operations of blocks of the method 500 can be repeated and/or omitted to form various multi-chip devices. The method 500 has been provided as an example of how some multi-chip devices can be formed. In other examples, some operations can be performed in parallel. For example, multiple different wafer stacks can be formed (e.g., by bonding and processing respective wafers) in parallel before the multiple different wafer stacks are then bonded together and further processed to form the multi-chip devices. A person having ordinary skill in the art will readily understand how to form other multi-chip devices based on the description of the method 500 above.

Figure 6:
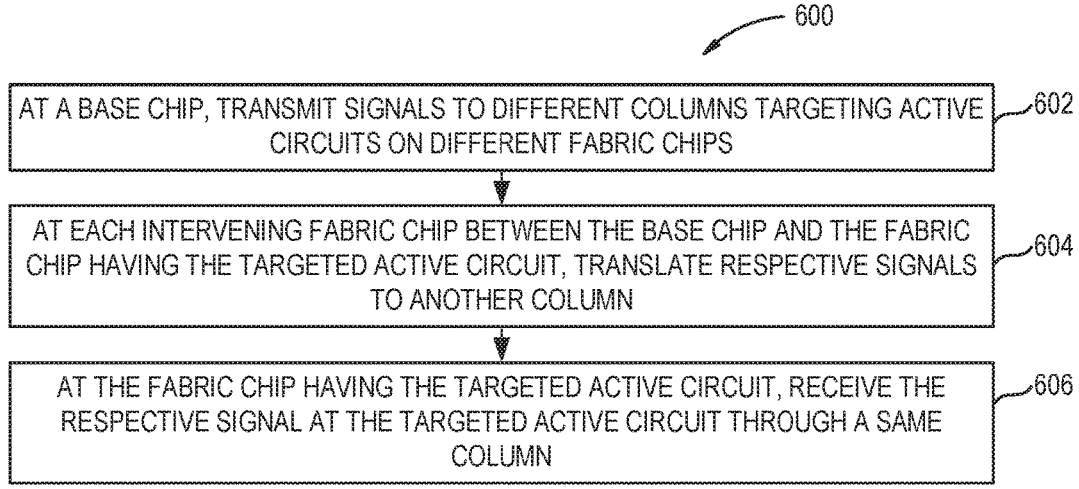
FIG. 6 is a flowchart of a method of operating a multi-chip device according to some examples.

FIG. 6 is a flowchart of a method 600 of operating a multi-chip device according to some examples. The multi-chip device can be as shown in FIGS. 1 through 4, for example. Various operations of the method 600 are described, for illustrative purposes, in the context of the multi-chip device of FIG. 3. A person having ordinary skill in the art will readily understand that such operations can be similarly performed or replicated on other multi-chip devices, such as the multi-chip device of FIG. 4.

The method 600 describes communicating signals between a base chip 102 and fabric chips 104-108. The method 600 is described in a directionality of signals being transmitted from the base chip 102 and received at the fabric chips 104-108. A person having ordinary skill in the art will readily understand that the method 600 can similarly be performed in an inverse order where signals are transmitted from the fabric chips 104-108 and received at the base chip 102. Any staggered via pillar can be implemented for unidirectional communications from the base chip 102 to a fabric chip 104-108, for unidirectional communications from a fabric chip 104-108 to the base chip 102, or for bidirectional communications between the base chip 102 and a fabric chip 104-108.

At block 602, at a base chip, signals are transmitted to different columns, where the signals target active circuits on different fabric chips. With reference to FIG. 3, signals 334-338 are transmitted to the different columns of broken via pillars. For example, the first signal 334 is transmitted to the second column of second broken via pillars 304-2, 306-2, 308-2 through the front side bond pad 152-2; the second signal 336 is transmitted to the third column of third broken via pillars 304-3, 306-3, 308-3 through the front side bond pad 152-3; and the third signal 338 is transmitted to the fourth column of fourth broken via pillars 304-4, 306-4, 308-4 through the front side bond pad 152-4. The first signal 334 targets an active circuit (e.g., the PL IC 224) on the fabric chip 104. The second signal 336 targets an active circuit (e.g., the PL IC 226) on the fabric chip 106. The third signal 338 targets an active circuit (e.g., the PL IC 228) on the fabric chip 108.

At block 604, at each intervening fabric chip between the base chip and the fabric chip having the targeted active circuit, respective signals are translated to another column. With reference to FIG. 3, the second signal 336 targeting the active circuit on the fabric chip 106 is translated in the intervening fabric chip 104 from the third column of third broken via pillars 304-3, 306-3, 308-3 to the second column of second broken via pillars 304-2, 306-2, 308-2 through the third-to-second bridge 314-32. The third signal 338 targeting the active circuit on the fabric chip 108 is translated in the intervening fabric chip 104 from the fourth column of fourth broken via pillars 304-4, 306-4, 308-4 to the third column of third broken via pillars 304-3, 306-3, 308-3 through the fourth-to-third bridge 314-43. The third signal 338 targeting the active circuit on the fabric chip 108 is further translated in the intervening fabric chip 106 from the third column of third broken via pillars 304-3, 306-3, 308-3 to the second column of second broken via pillars 304-2, 306-2, 308-2 through the third-to-second bridge 316-32.

At block 606, at the fabric chip having the targeted active circuit, the respective signal is received at the targeted active circuit through a same column. With reference to FIG. 3, the first signal 334 is received at the active circuit (e.g., PL IC 224) of the fabric chip 104 through the second column of second broken via pillars 304-2, 306-2, 308-2 (e.g., through the second continuous via pillar portion 304-22), and further through the second-to-first bridge 314-21 and interconnections 324. The second signal 336 is received at the active circuit (e.g., PL IC 224) of the fabric chip 106 through the second column of second broken via pillars 304-2, 306-2, 308-2 (e.g., through the second continuous via pillar portion 306-22), and further through the second-to-first bridge 316-21 and interconnections 326. The third signal 338 is received at the active circuit (e.g., PL IC 228) of the fabric chip 108 through the second column of second broken via pillars 304-2, 306-2, 308-2 (e.g., through the second continuous via pillar portion 308-22), and further through the second-to-first bridge 318-21 and interconnections 328.

While the foregoing is directed to specific examples, other and further examples may be devised without departing from the basic scope thereof, and the scope thereof is determined by the claims that follow.

What is claimed is:

1. A multi-chip device comprising:
   a chip stack comprising chips, neighboring ones of the chips being connected to each other, a plurality of the chips collectively comprising:
      columns of broken via pillars, each chip of the plurality of the chips having a broken via pillar in each column of the columns, the broken via pillar having a first continuous via pillar portion and a second continuous via pillar portion aligned in a direction normal to a side of a semiconductor substrate of the respective chip, the first continuous via pillar portion not being connected within the broken via pillar to the second continuous via pillar portion; and
      bridges, each chip of the plurality of the chips having one or more of the bridges, each bridge of the bridges connecting, within the respective chip, the first continuous via pillar portion in a column of the columns and the second continuous via pillar portion in another column of the columns.

2. The multi-chip device of claim 1, wherein at each interface between neighboring chips of the plurality of the chips and in each column of the columns, the first continuous via pillar portion of the respective column and in one chip of the respective neighboring chips is connected to the second continuous via pillar portion of the respective column and in another one chip of the respective neighboring chips.

3. The multi-chip device of claim 1, wherein each chip of the plurality of the chips includes an active circuit, the active circuits of the plurality of the chips being connected to a same column of the columns within the respective chip.

4. The multi-chip device of claim 3, wherein the chips include a base chip having connections to each column of the columns at an interface with one chip of the plurality of the chips, the base chip being configured to communicate with the respective active circuits of the plurality of the chips through, at the interface, different respective ones of the columns.

5. The multi-chip device of claim 1, wherein the chips include a base chip, the base chip including first pads at an interface with one chip of the plurality of the chips, the one chip of the plurality of the chips including second pads at the interface, each column of the columns including a respective pad of the second pads that is connected to a respective pad of the first pads.

6. The multi-chip device of claim 5, wherein at least two of the plurality of the chips are each oriented with a front side facing towards the base chip.

7. The multi-chip device of claim 5, wherein at least two of the plurality of the chips are each oriented with a front side facing away from the base chip.

8. The multi-chip device of claim 1, wherein the first continuous via pillar portions in one or more of the chips each include a through substrate via (TSV) through the semiconductor substrate of the respective chip.

9. The multi-chip device of claim 1, wherein each chip of the plurality of the chips has a same hardware layout.

10. A method of operating a multi-chip device, the method comprising:
    communicating a signal between a first chip and a second chip, the first chip and the second chip being in a chip stack, one or more intervening chips being disposed in the chip stack between the first chip and the second chip, wherein:
       at each of the one or more intervening chips, communicating the signal includes communicating the signal from a broken via pillar column to another broken via pillar column, each of the broken via pillar columns extending across the one or more intervening chips; and
       each of the broken via pillar columns at each of the one or more intervening chips includes a first continuous via pillar portion and a second continuous via pillar portion disposed in the respective chip, the first continuous via pillar portion not being connected, within the respective broken via pillar column, to the second continuous via pillar portion.

11. The method of claim 10, wherein, at each of the one or more intervening chips, a bridge is disposed within the respective chip and connects the first continuous via pillar portion of the broken via pillar column to the second continuous via pillar portion of the other broken via pillar column.

12. The method of claim 10 further comprising communicating a respective signal between the first chip and each of the one or more intervening chips, each of the one or more intervening chips and the second chip comprising an active circuit, the active circuits being connected to a same broken via pillar column through an interconnection of the respective chip.

13. The method of claim 12, wherein the first chip includes pads, each of the pads is connected to a different broken via pillar column, each of the signals communicated between the first chip and the second chip and between the first chip and the one or more intervening chips being communicated through a different one of the pads.

14. The method of claim 10, wherein each of the first continuous via pillar portions includes a through substrate via (TSV) through a semiconductor substrate of the respective chip.

15. The method of claim 10, wherein the one or more intervening chips includes two or more intervening chips having a same hardware layout.

16. A multi-chip device comprising:
a chip stack comprising chips, a first chip of the chip stack comprising:
- a first continuous via pillar portion having a first pad at an interface between the first chip and an underlying chip of the chip stack, the first continuous via pillar portion being connected through an interconnection to an active circuit of the first chip;
- a second continuous via pillar portion having a second pad at an interface between the first chip and an overlying chip of the chip stack, the second pad being aligned with the first pad, the second continuous via pillar portion not being connected to the first continuous via pillar portion;
- a third continuous via pillar portion having a third pad at the interface between the first chip and the underlying chip; and
- a first bridge connecting the third continuous via pillar portion and the second continuous via pillar portion.

17. The multi-chip device of claim 16, wherein the first chip further comprises:
- a fourth continuous via pillar portion having a fourth pad at the interface between the first chip and the overlying chip, the fourth pad being aligned with the third pad, the fourth continuous via pillar portion not being connected to the third continuous via pillar portion;
- a fifth continuous via pillar portion having a fifth pad at the interface between the first chip and the underlying chip; and
- a second bridge connecting the fifth continuous via pillar portion and the fourth continuous via pillar portion.

18. The multi-chip device of claim 16, wherein:
the first chip further comprises a fourth continuous via pillar portion having a fourth pad at the interface between the first chip and the overlying chip, the fourth pad being aligned with the third pad, the fourth continuous via pillar portion not being connected to the third continuous via pillar portion;

the overlying chip comprises:
- a fifth continuous via pillar portion having a fifth pad at the interface between the first chip and the overlying chip, the fifth pad being connected to the second pad, the fifth continuous via pillar portion being connected through an interconnection to an active circuit of the overlying chip;
- a sixth continuous via pillar portion aligned with the fifth continuous via pillar portion, the sixth continuous via pillar portion not being connected to the fifth continuous via pillar portion;
- a seventh continuous via pillar portion having a seventh pad at the interface between the first chip and the overlying chip, the seventh pad being connected to the fourth pad;
- an eighth continuous via pillar portion aligned with the seventh continuous via pillar portion, the eighth continuous via pillar portion not being connected to the seventh continuous via pillar portion; and
- a second bridge connecting the seventh continuous via pillar portion and the sixth continuous via pillar portion;

the first continuous via pillar portion, the second continuous via pillar portion, the fifth continuous via pillar portion, and the sixth continuous via pillar portion are aligned in a first broken via pillar column; and
the third continuous via pillar portion, the fourth continuous via pillar portion, the seventh continuous via pillar portion, and the eighth continuous via pillar portion are aligned in a second broken via pillar column.

19. The multi-chip device of claim 16, wherein the underlying chip is configured to communicate a signal with the first chip through the first pad and to communicate a signal with the overlying chip through the third pad.

20. The multi-chip device of claim 16, wherein the overlying chip has a same hardware layout as the first chip.

* * * * *